United States Patent
Lai et al.

(10) Patent No.: US 7,584,781 B2
(45) Date of Patent: Sep. 8, 2009

(54) LIQUID-COOLING DEVICE

(75) Inventors: Cheng-Tien Lai, Tu-Cheng (TW); Zhi-Yong Zhou, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 170 days.

(21) Appl. No.: 11/309,491

(22) Filed: Aug. 11, 2006

(65) Prior Publication Data

US 2007/0246204 A1  Oct. 25, 2007

(30) Foreign Application Priority Data

Apr. 21, 2006  (CN)  .................. 2006 1 0060408

(51) Int. Cl.
 *F28F 7/00*  (2006.01)
 *F28F 3/12*  (2006.01)
 *H05K 7/20*  (2006.01)

(52) U.S. Cl. .................. 165/80.4; 165/166; 165/170

(58) Field of Classification Search ............... 165/80.4, 165/104.33, 153, 166, 167, 168, 170; 361/699, 361/702; 257/714

See application file for complete search history.

(56) References Cited

U.S. PATENT DOCUMENTS

| | | | | |
|---|---|---|---|---|
| 2,484,123 A * | 10/1949 | Scherl | ..................... | 239/132.3 |
| 2,656,159 A * | 10/1953 | Hammond et al. | .......... | 165/166 |
| 4,494,171 A * | 1/1985 | Bland et al. | ................. | 361/704 |
| 4,956,746 A * | 9/1990 | Gates et al. | ................. | 361/699 |
| 5,423,376 A | 6/1995 | Julien et al. | | |
| 6,014,312 A * | 1/2000 | Schulz-Harder et al. | .... | 361/699 |
| 6,273,186 B1 * | 8/2001 | Ognibene et al. | ........... | 165/185 |
| 6,345,665 B1 * | 2/2002 | Schulz-Harder | ........... | 165/80.4 |
| 6,634,421 B2 * | 10/2003 | Ognibene et al. | ........... | 165/166 |
| 7,044,198 B2 * | 5/2006 | Matsushima et al. | ....... | 165/80.4 |
| 2003/0192681 A1 * | 10/2003 | Yamauchi et al. | ........... | 165/148 |
| 2005/0133212 A1 * | 6/2005 | Wilson et al. | ............... | 165/168 |

* cited by examiner

*Primary Examiner*—Tho V Duong
(74) *Attorney, Agent, or Firm*—Frank R. Niranjan

(57) ABSTRACT

A liquid cooling device includes a base, a housing and a heat exchanger. The base and the housing enclose a chamber which receives the heat exchanger therein. Inlet and outlet for liquid are provided at the housing. The heat exchanger includes stacked flakes. Each flake includes parallel and alternately arranged first and second strips each having a void defined therein. The flakes are stacked in a manner such that each first strip overlays and abuts against a corresponding second strip of an adjacent flake and that the void in each first strip and the void in the corresponding second strip of the adjacent flake are in fluid communication with each other to thereby form a channel between the inlet and the outlet.

5 Claims, 7 Drawing Sheets

LIQUID-COOLING DEVICE

FIELD OF THE INVENTION

The present invention relates generally to cooling devices, and more particularly to a liquid-cooling device for dissipating waste heat generated by electrical or electronic components and assemblies.

DESCRIPTION OF RELATED ART

Nowadays, various cooling devices are used to remove heat from electrical or electronic components which generate a large amount of heat during operation. Metallic heat sinks with fins and heat pipes, heat exchangers utilizing phase-change, liquid cooling devices are in most common use. In a liquid cooling device, a plurality of channels is defined for travel of liquid which carries heat therein. Generally, the channels in the liquid cooling device are formed by milling and drilling a metal stock, for example, a copper block. The milling and drilling process incurs a high manufacturing cost of the liquid cooling device. Moreover, to enhance the performance of the liquid cooling device to meet the ever increasing amount of heat of the electronic component needing to be dissipated requires the liquid cooling device to increase its size (and accordingly weight) proportionally. The increase of the size and weight of the liquid cooling device conflicts the tendency of compactness and portability of the electronic industry.

What is needed is a liquid cooling device which is compact and has a high work performance.

SUMMARY OF THE INVENTION

A liquid cooling device in accordance with a preferred embodiment of the present invention comprises a base, a housing and a heat exchanger. The base and the housing enclose a chamber which receives the heat exchanger therein. The heat exchanger comprises stacked flakes. Each flake comprises parallel and alternately arranged first and second strips, wherein the first strip has cutouts in two opposite ends thereof, and the second strip has a central slot. The flakes are stacked in a manner such that each first strip overlays and abuts against a second strip of an adjacent flake and that the cutouts in each first strip and the slot in a corresponding second strip of the adjacent flake are in fluid communication with each other and corporately define a channel between inlet and the outlet of the liquid cooling device.

Other advantages and novel features will become more apparent from the following detailed description of preferred embodiments when taken in conjunction with the accompanying drawings, in which:

BRIEF DESCRIPTION OF THE DRAWINGS

Many aspects of the present devices can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Referring to FIGS. 1-5, a liquid cooling device in accordance with a preferred embodiment of the present invention is especially useful in efficiently dissipating heat from highly integrated heat sources such as microprocessors or computer chips operating under high heat flux conditions. The liquid cooling device comprises a base 10, a heat exchanger 30 and a housing 20.

Figure 1:
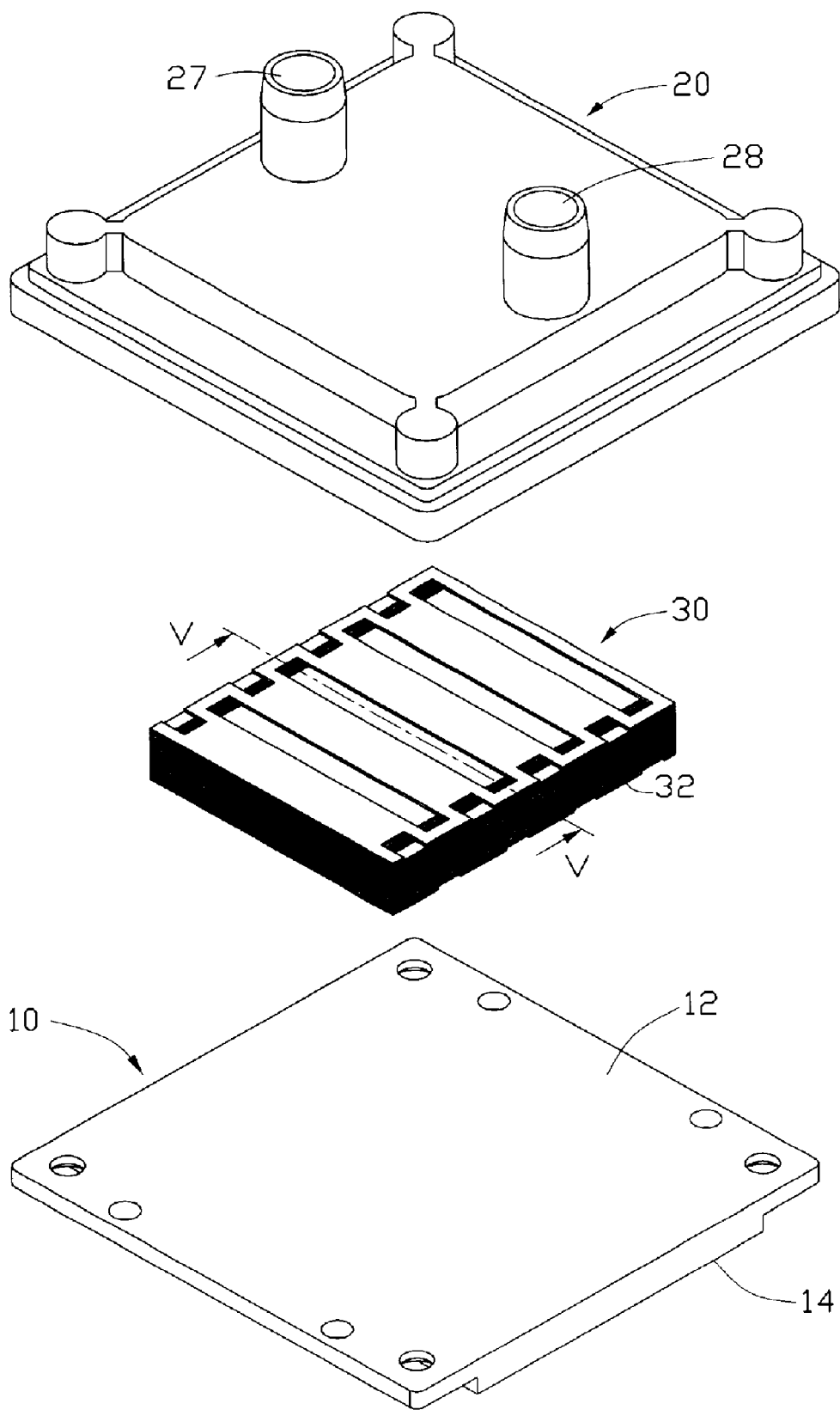
FIG. 1 an exploded, isometric view of a liquid cooling device in accordance with a preferred embodiment of the present invention.
Figure 2:
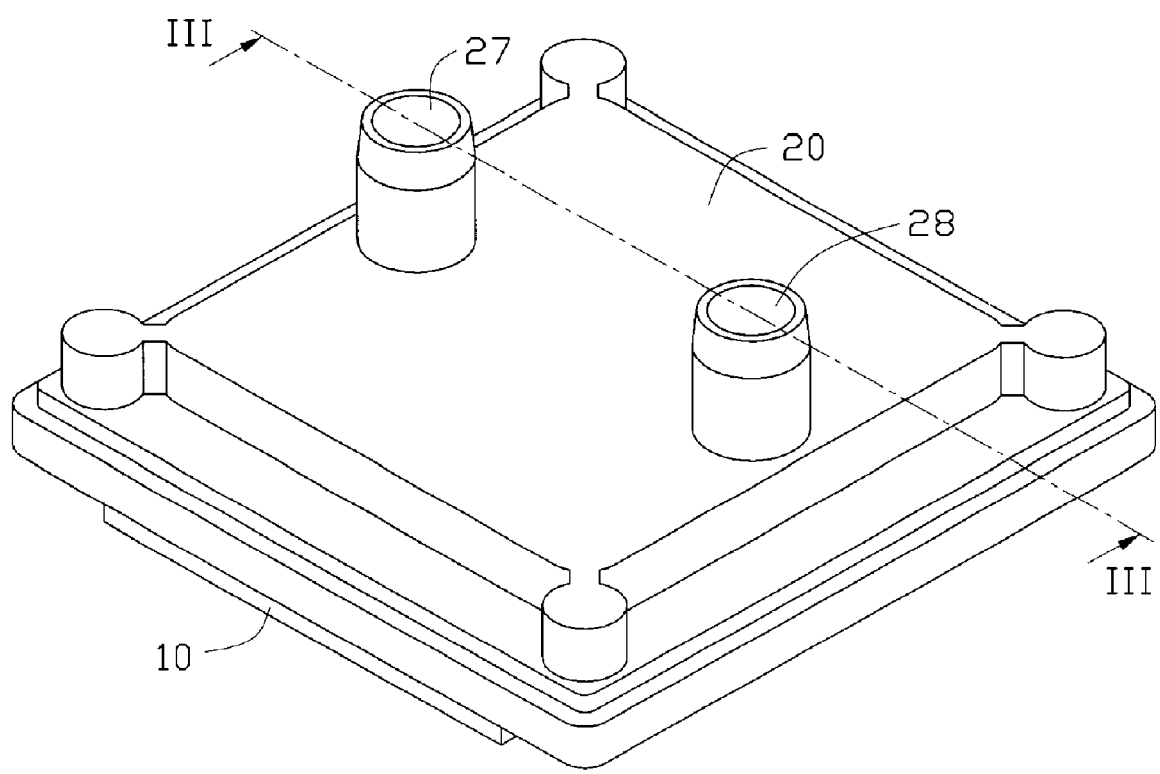
FIG. 2 is an assembled view of FIG. 1.
Figure 3:
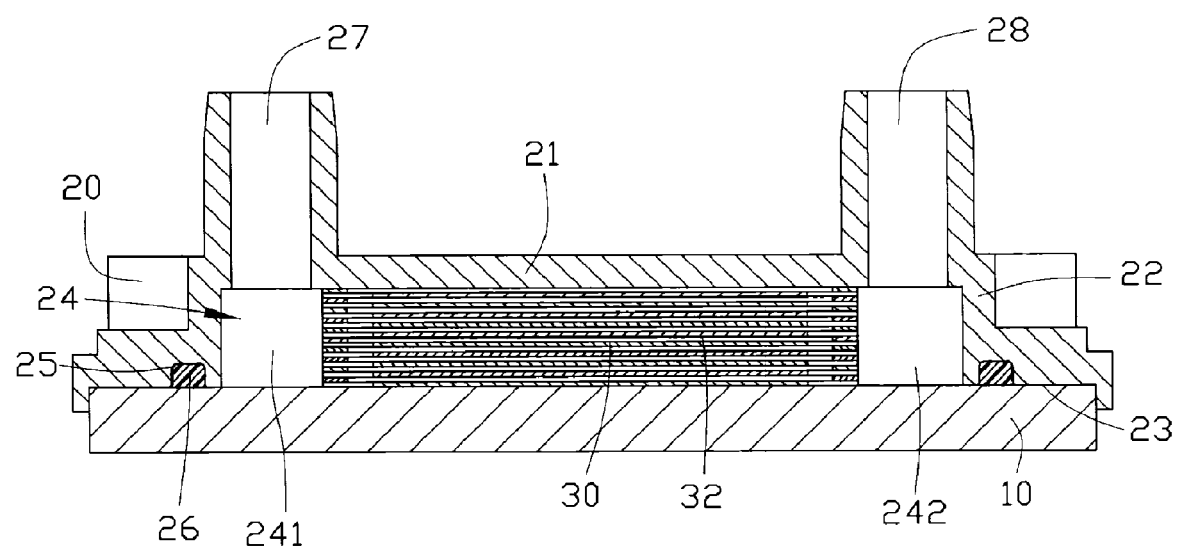
FIG. 3 is a cross-sectional view of FIG. 2, taken along line III-III thereof.

Referring to FIGS. 1-3, the base 10 is of a shape substantially rectangular or square although it is not limited to this shape. The base 10 is made of a thermally conductive material, such as copper or aluminum. The base 10 has a top surface 12 and a bottom surface 14 which is used for contacting a heat source (not shown).

Figure 6:
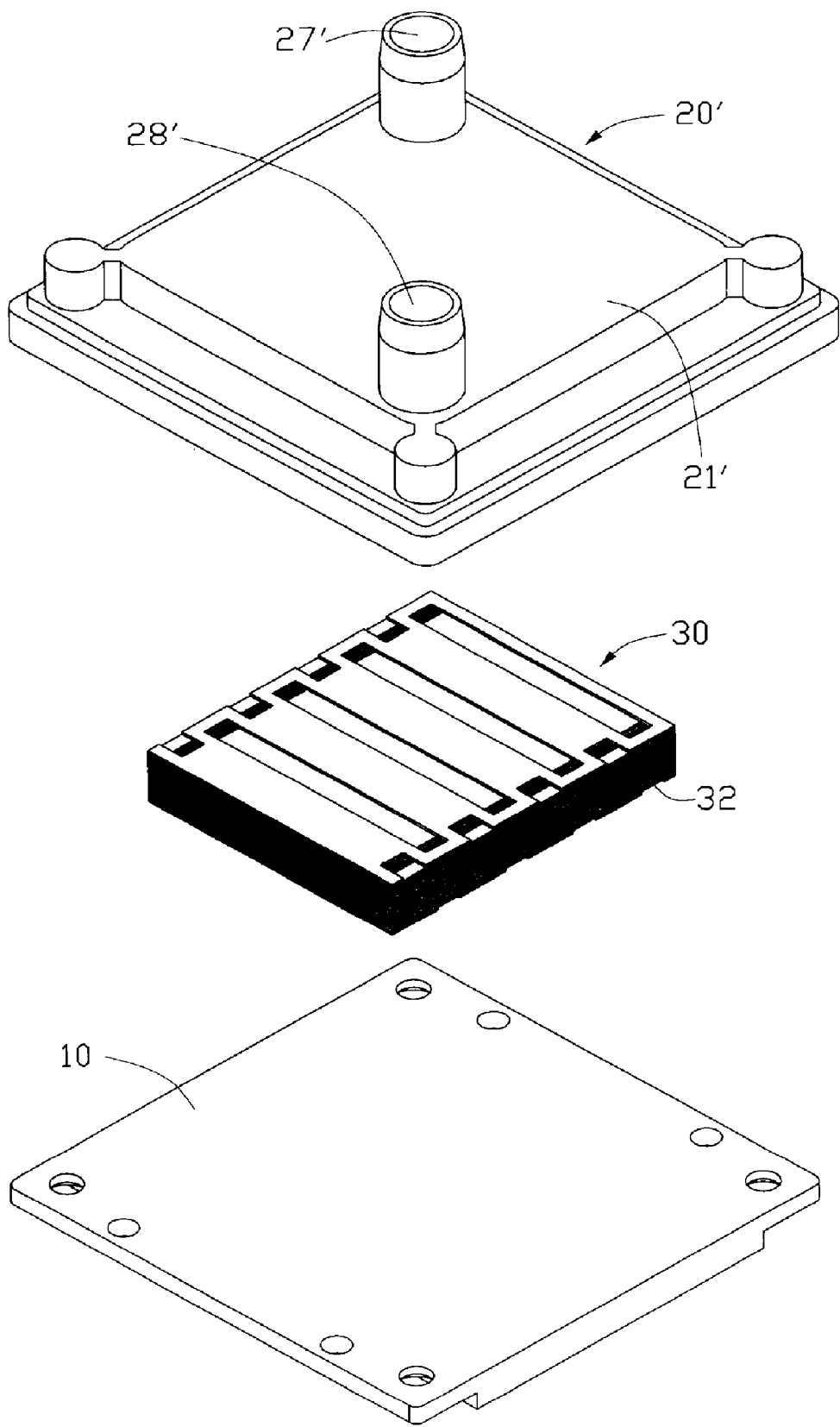
FIG. 6 is an isometric view of a liquid cooling device in accordance with an alternative embodiment of the present invention.

The housing 20 is fastened to the base 10 by any conventional means to form a casing (not labeled). The housing 20 has a top wall 21 and a peripheral sidewall 22 extending downwardly from a perimeter of the top wall 21. The sidewall 22 has a bottom edge surface 23 to engage the base 10 so that the housing 20 and the base 10 corporately define a chamber 24 therein for receiving the heat exchanger 30 therein. An annular slot 25 is defined in the bottom edge surface 23 so as to accommodate a sealing ring 26 for ensuring a hermetical seal of the chamber 24 (see FIG. 3). An inlet 27 and an outlet 28 are defined through the top wall 21 of the housing 20 so as to be in fluid communication with the chamber 24. The inlet 27 and the outlet 28 are located at centers of opposite sides of the top wall 21, respectively, in accordance with this preferred embodiment. In another embodiment of FIG. 6, inlet 27' and outlet 28' are respectively located at opposite corners of a top wall 21' of a housing 20'.

Particularly referring to FIG. 3, the heat exchanger 30 is disposed within a center of the chamber 24 defined by the base 10 and the housing 20, so that a pair of containing rooms 241, 242 is formed in the chamber 24 and located at opposite sides of the heat exchanger 30. The containing rooms 241, 242 are located directly below the inlet 27 and the outlet 28, respectively. The heat exchanger 30 has a bottom surface thereof thermally coupled to the top surface 12 of the base 10 and a top surface thereof being in contact with a bottom surface of the top wall 21. The containing room 241 is in fluid communication with the inlet 27 and the containing room 242 is in fluid communication with the outlet 28. The heat exchanger 30 defines a plurality of channels 32 therein. The channels 32 provide passages for liquid to flow from the containing room 241 to the containing room 242.

Figure 4:
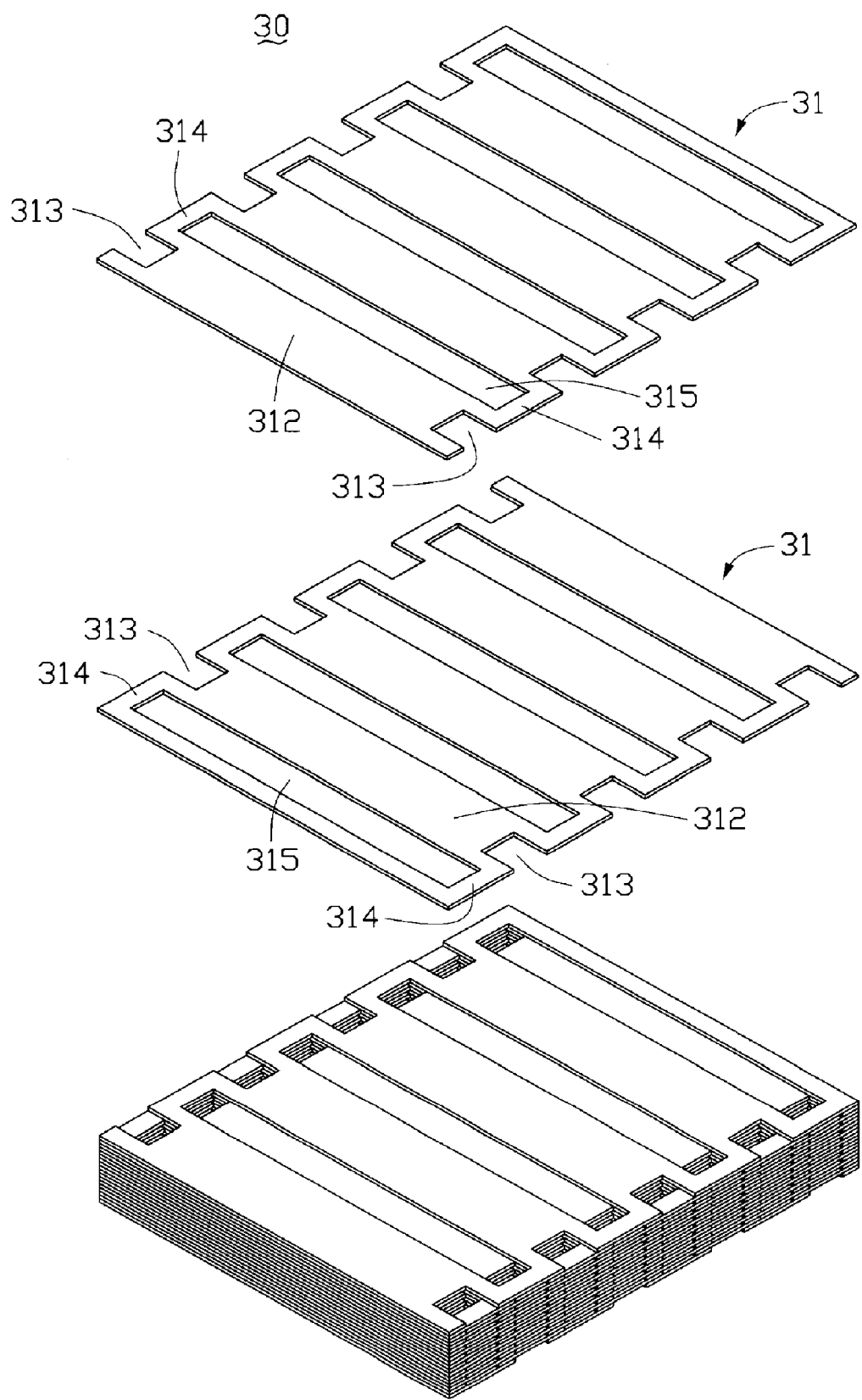
FIG. 4 is a partially exploded view of a heat exchanger of the liquid cooling device of FIG. 1.
Figure 5:
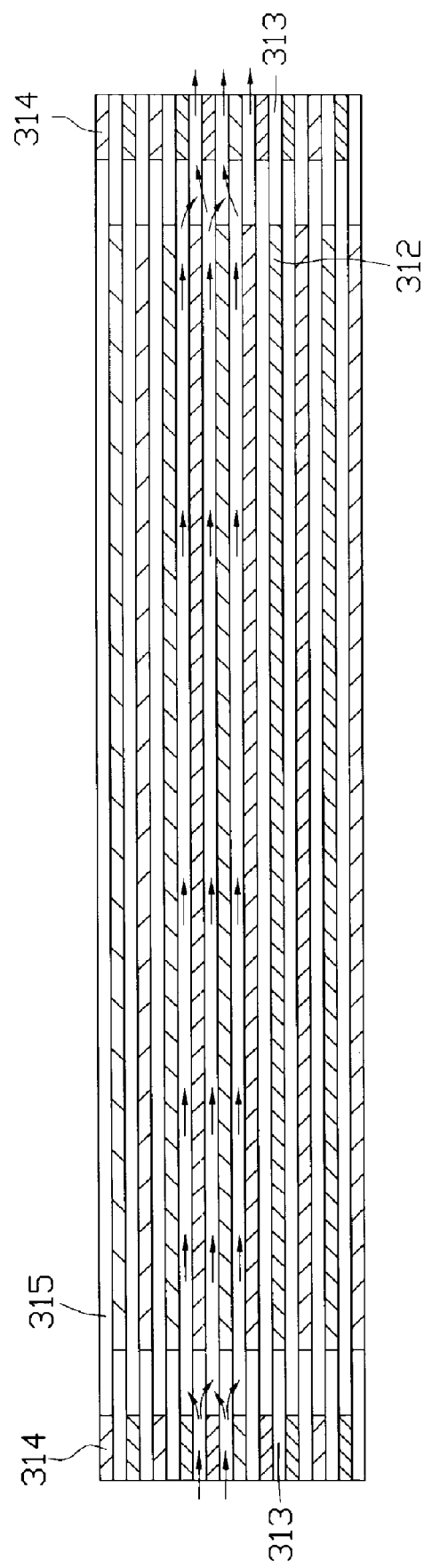
FIG. 5 is a cross-sectional view of the heat exchanger of FIG. 1, taken along line V-V thereof.

Particularly referring to FIGS. 4-5, the heat exchanger 30 comprises a plurality of heat exchanging flakes 31 each being arranged parallel to the base 10 and having a rectangular shape. Each flake 31 comprises a plurality of parallel first and second strips 312, 314 which are elongated and alternately arranged. Each first strip 312 defines a pair of cutouts 313 in opposite ends thereof. Each second strip 314 defines an elongated central slot 315 therein. A length of the first strip 312 measured between the two cutouts 313 is shorter than a length of the central slot 315 of the second strip 314.

The plurality of the heat exchanging flakes 31 has same size and shape, and is stacked together along a vertical direction. Two neighboring heat exchanging flakes 31 have opposite orientations so that the first strips 312 of an upper heat exchanging flake 31 abut against and overlay the second strips 314 of a lower heat exchanging flake 31. After all of the flakes 31 are stacked together, the first strips 312 are alternated with the second strips 314 along the vertical direction of the heat exchanger 30. The flakes 31 are arranged in such a manner that, as clearly shown in FIG. 5, the cutouts 313 of each first strip 312 communicate with the elongated slot 315 of a corresponding second strip 314 of an adjacent flake 31 to allow liquid to flow from one of the cutouts 413 in communication with the containing room 241 to flow to the other of the cutouts 413 in communication with containing room 242 via each first strip 412 and the slot 415 of the corresponding second strip 414 of the adjacent flake 41. Therefore, the cutouts 313 of each first strip 312 and the elongated slot 315 of the corresponding second strip 413 of the adjacent flake 31 can corporately form one of the channels 32 to provide a passage (as shown in arrows in FIG. 5) for the liquid flowing from the containing room 241 to the containing room 242.

In operation of the liquid cooling device, the base 10 absorbs heat from a heat source (not shown); the heat is then transferred from the base 10 to the heat exchanger 30 and distributes to the flakes 31 of the heat exchanger 30. Liquid entering the containing room 241 of the chamber 24 through the inlet 27, travels through the channels 32 of the heat exchanger 30, and then arrives at the containing room 242 of the chamber 24. Heat exchange takes place between the liquid and the heat exchanger 30 when the liquid flows through the channels 32 of the exchanger 30. The liquid takes the heat exchanged with the flakes 31 out of the liquid cooling device through the outlet 28, and then is cooled to be available for a sequent circulation.

Figure 7:
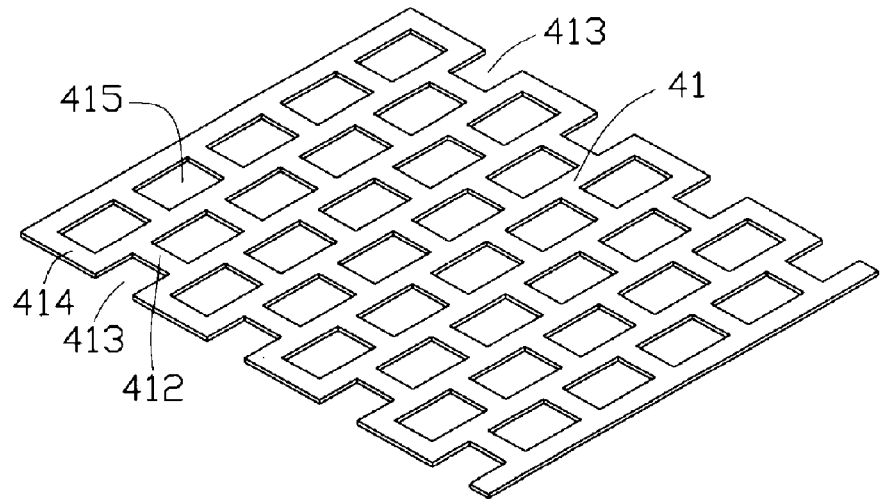
FIG. 7 is a partially exploded view of a heat exchanger of a liquid cooling device in accordance with a further embodiment of the present invention.
Figure 7:
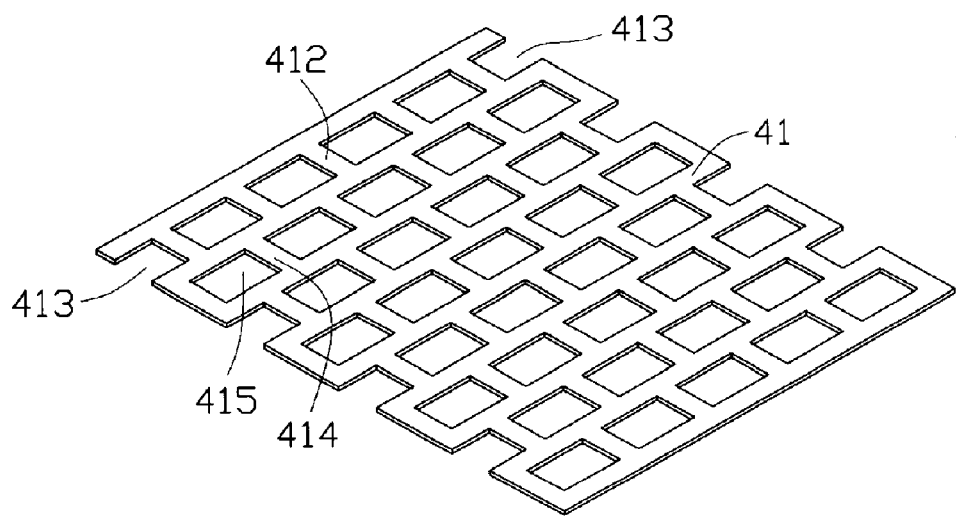
Figure 7:
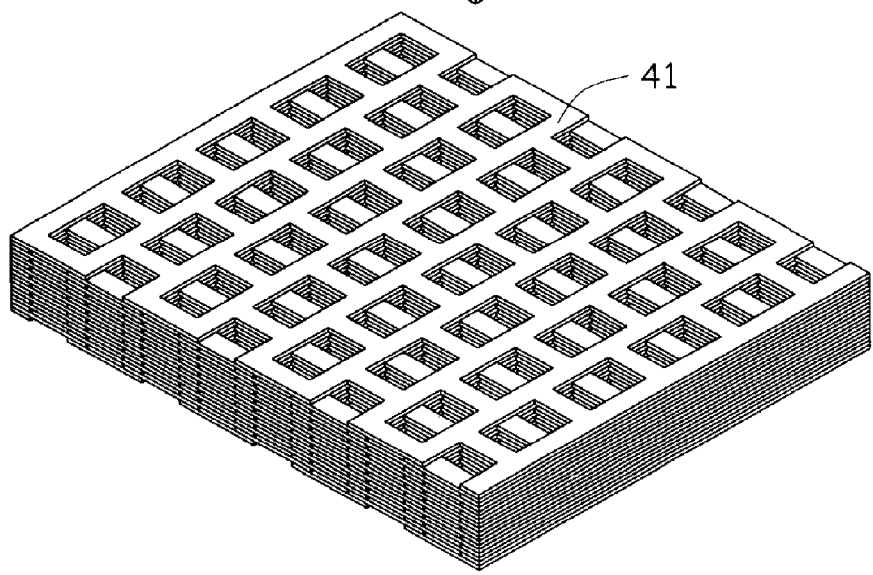

FIG. 7 shows another heat exchanger 40 which is available to be placed in the chamber 24 enclosed by the base 10 and the housing 20 of the first embodiment of FIG. 1-5, to perform a same function as the heat exchanger 30. The heat exchanger 40 comprises a plurality of heat exchanging flakes 41 each having a rectangular shape. Each flake 41 comprises a plurality of parallel first and second strips 412, 414 which are elongated and alternately arranged. A row of cutouts 413 is discretely arranged in the first strip 412 along a first direction, i.e., a length direction of the first strip 412. A row of slots 415 is discretely arranged in the second strip 414 along the first direction, i.e., a length direction of the second strip 414. The cutouts 413 of the first strips 412 are staggered with the slots 415 of the second strips 414, along a second direction, i.e., a width direction of the first and second strips 412, 414, which is perpendicular to the first direction. The endmost cutouts 413 each extend through an outer boundary of a corresponding end of the first strip 412.

The plurality of the heat exchanging flakes 41 has same size and shape and is stacked together. After all of the flakes 41 are stacked together, each first strip 312 of each flake 31 overlays and abuts against a second strip 314 of an adjacent flake 31. The flakes 41 are oriented in such a manner that the first strips 412 are parallel to the second strips 414, and that in any two adjacent flakes 41, the cutouts 413 of each first strip 412 and the slots 415 of the corresponding second strip 414 of the adjacent flake 41 communicate with each other to allow liquid to alternately flow in the cutouts 413 of each first strip 412 and the slots 415 of the corresponding second strip 414 of the adjacent flake 41. Therefore, the cutouts 413 of each first strip 412 and the slots 415 of the corresponding second strip 414 of the adjacent flake 41 can corporately form a channel to provide a passage for the liquid flowing from the containing room 241 to the containing room 242. The cutouts 413, except the endmost ones, each have a size the same as that of each of the slots 415. Furthermore, ribs (not labeled) between two neighboring cutouts 413 and two neighboring slots 415 each have a length along the first direction, which is smaller than a length of each of the cutouts 413 and slots 415 along the first direction.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A liquid cooling device comprising:
   a base;
   a housing fastened to the base and defining a chamber with the base for containing liquid therein, the housing comprising an inlet and an outlet in communication with the chamber;
   a heat exchanger disposed within the chamber and comprising a plurality of stacked flakes, each flake having a plurality of first strips and a plurality of second strips, each first strip defining two cutouts in two opposite end edges thereof, each second strip defining at least a slot therein;
   wherein the first strips and the second strips of each flake are alternately arranged, the flakes being oriented in such a manner that the first strips of each flake are located in alignment with and attached to the second strips of a neighboring flake and the two cutouts of each first strip of the each flake are in fluid communication with the at least a slot of a corresponding second strip of the neighboring flake to thereby allow the liquid to flow through the heat exchanger via the two cutouts and the at least a slot;
   wherein the first and second strips are elongated and parallel to each other; and
   wherein the at least a slot defined in the each second strip is elongated and disposed at a center of the each second strip, and wherein a length of the each first strip between the two cutouts is shorter than a length of the at least a slot of the each second strip.

2. The liquid cooling device as claimed in claim 1, wherein each flake has a rectangular shape and is parallel to the base.

3. A cooling device comprising:
   a casing having an inlet and an outlet for liquid;
   a heat exchanger disposed in the casing, the heat exchanger comprising a plurality of flakes, each flake comprising a plurality of first strips and a plurality of second strips, the first strips and the second strips each defining a void therein, the flakes being stacked in a manner such that each first strip overlays and abuts against a corresponding second strip of an adjacent flake and that the void in the each first strip and the void in the corresponding second strip of the adjacent flake are in fluid communication with each other and corporately define a channel between the inlet and the outlet;
   wherein the first strips and the second strips of the each flake are arranged alternately and parallel to each other;
   wherein in each flake the voids of the first strips are staggered with the voids of the second strips;

wherein the first strips and the second strips are elongated; and wherein the void in the each first strip comprises a pair of cutouts defined at opposite ends thereof, and the void in the each second strip comprises an elongated slot defined at a center thereof.

4. The cooling device as claimed in claim 3, wherein two containing rooms are defined in the casing, communicating with the inlet and the outlet, respectively, and being fluidly connected together by the channels in the heat exchanger.

5. A liquid cooling device comprising:

a casing having a base adapted for thermally connecting with a heat-generating electronic component, a housing located on the base and having an inlet and an outlet for liquid entering the casing and leaving the casing, respectively, a first containing room in fluidic communication with the inlet and a second containing room in fluidic communication with the outlet; and a heat exchanger received in the casing and between the first and second containing rooms, the heat changer comprising a plurality of flakes staked on each other, each flake having a plurality of first strips and a plurality of second strips, each of the first strips defining at least two cutouts in two opposite sides of the each flake adjacent to the first and second containing rooms, respectively, each of the second strips defining at least a slot therein, the flakes being so arranged that the first strips of one of the flakes overlay and abut against the second strips of a neighboring one of the flakes, wherein the at least two cutouts are in fluidic communication with the at least a slot to form a channel whereby the liquid can flow from the inlet, the first containing room, the channel and the second containing room to reach the outlet;

wherein the first strips and the second strips of the each flake are alternate with each other; and wherein each of the first strips defines only two cutouts in the two opposite sides of the each flake and each of the second strips defines only one slot in fluidic communication with the only two cutouts to form the channel.

* * * * *

UNITED STATES PATENT AND TRADEMARK OFFICE
CERTIFICATE OF CORRECTION

PATENT NO. : 7,584,781 B2  Page 1 of 1
APPLICATION NO. : 11/309491
DATED : September 8, 2009
INVENTOR(S) : Lai et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 198 days.

Signed and Sealed this

Fourteenth Day of September, 2010

David J. Kappos
*Director of the United States Patent and Trademark Office*